US011624791B2

(12) United States Patent
Romero (10) Patent No.: US 11,624,791 B2
(45) Date of Patent: *Apr. 11, 2023

(54) REDUCING STRAY MAGNETIC-FIELD EFFECTS USING A MAGNETIC-FIELD CLOSED-LOOP SYSTEM

(71) Applicant: Allegro MicroSystems, LLC, Manchester, NH (US)

(72) Inventor: Hernán D. Romero, Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/937,556

(22) Filed: Oct. 3, 2022

(65) Prior Publication Data

US 2023/0027608 A1    Jan. 26, 2023

Related U.S. Application Data

(63) Continuation of application No. 17/140,429, filed on Jan. 4, 2021, now Pat. No. 11,555,872.

(51) Int. Cl.
*G01R 33/00* (2006.01)
*G01R 33/09* (2006.01)

(52) U.S. Cl.
CPC ....... *G01R 33/098* (2013.01); *G01R 33/0041* (2013.01); *G01R 33/091* (2013.01)

(58) Field of Classification Search
CPC . G01R 33/098; G01R 33/091; G01R 33/0041
See application file for complete search history.

(56) References Cited

U.S. PATENT DOCUMENTS

| 6,043,644 A | 3/2000 | de Coulon et al. |
| 7,923,996 B2 | 4/2011 | Doogue et al. |
| (Continued) | | |

FOREIGN PATENT DOCUMENTS

EP    3 954 971 A1    2/2022

OTHER PUBLICATIONS

Extended European Search Report dated Oct. 28, 2022 for European Application No. 22172865.2; 8 Pages.
(Continued)

*Primary Examiner* — Alesa Allgood
(74) *Attorney, Agent, or Firm* — Daly, Crowley, Mofford & Durkee, LLP (57) ABSTRACT

In one aspect, a magnetic-field sensor includes main coil circuitry configured to generate a first magnetic field signal at a first frequency. A reflected signal is generated from a target caused by the first signal generated by the main coil circuitry. The magnetic field sensor also includes magnetoresistance circuitry configured to receive an error signal. The error signal is formed from a combination of the reflected signal and a second magnetic field signal. The magnetic-field sensor further includes analog circuitry configured to receive an output signal from the magnetoresistance circuitry, digital circuitry configured to receive an output signal from the analog circuitry, a mixer configured to receive a feedback signal from one of the digital circuitry or the analog circuitry, and secondary coil circuitry configured to receive a driver signal from the mixer causing the secondary coil circuitry to generate the second magnetic field signal at the first frequency.

17 Claims, 5 Drawing Sheets

(56) References Cited

U.S. PATENT DOCUMENTS

| | | | |
|---|---|---|---|
| 8,030,918 B2 | 10/2011 | Doogue et al. | |
| 8,447,556 B2 | 5/2013 | Friedrich et al. | |
| 8,542,010 B2 | 9/2013 | Cesaretti et al. | |
| 8,680,846 B2 | 3/2014 | Cesaretti et al. | |
| 8,692,546 B2 | 4/2014 | Cesaretti et al. | |
| 8,818,749 B2 | 8/2014 | Friedrich et al. | |
| 9,151,807 B2 | 10/2015 | Friedrich et al. | |
| 10,444,299 B2 | 10/2019 | Romero et al. | |
| 10,481,219 B2 | 11/2019 | Romero et al. | |
| 10,763,219 B2 | 9/2020 | Almiron et al. | |
| 11,555,872 B2 * | 1/2023 | Romero | G01R 33/0082 |
| 2009/0024889 A1 | 1/2009 | Forrest et al. | |
| 2016/0025820 A1 | 1/2016 | Scheller et al. | |
| 2018/0340986 A1 | 11/2018 | Latham et al. | |
| 2018/0340989 A1 | 11/2018 | Latham et al. | |
| 2019/0025346 A1 | 1/2019 | Latham | |
| 2019/0079146 A1 | 3/2019 | Romero et al. | |
| 2019/0312579 A1 | 10/2019 | Romero | |
| 2020/0225298 A1 * | 7/2020 | Latham | G01D 5/2013 |
| 2021/0181269 A1 | 6/2021 | Ishida et al. | |
| 2022/0214410 A1 | 7/2022 | Romero | |

OTHER PUBLICATIONS

U.S. Appl. No. 16/870,265, filed May 8, 2020, Romero.
U.S. Appl. No. 17/186,346, filed Feb. 26, 2021, Romero.
U.S. Appl. No. 17/659,515, filed Apr. 18, 2022, Romero.
U.S. Notice of Allowance dated Jul. 29, 2022 for U.S. Appl. No. 17/140,429; 11 Pages.
$1^{st}$ Amendment under Rule 312 filed on Aug. 15, 2022 for U.S. Appl. No. 17/140,429; 5 Pages.
$2^{nd}$ Amendment under Rule 312 filed on Oct. 3, 2022 for U.S. Appl. No. 17/140,429; 7 Pages.

* cited by examiner

REDUCING STRAY MAGNETIC-FIELD EFFECTS USING A MAGNETIC-FIELD CLOSED-LOOP SYSTEM

CROSS REFERENCE TO RELATED APPLICATION

This application is a continuation of U.S. patent application Ser. No. 17/140,429 filed Jan. 4, 2021 and entitled "REDUCING STRAY MAGNETIC-FIELD EFFECTS USING A MAGNETIC-FIELD CLOSED-LOOP SYSTEM," the entire content of which is incorporated herein by reference.

BACKGROUND

There are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

A linear range refers to a range where changes in a magnetic-field intensity is linear with changes in resistance. Some magnetoresistance elements, such as a TMR, have a limited linear range.

Magnetic-field sensors are often used to detect a ferromagnetic target. Magnetic-field sensors generally act as sensors to detect motion or position of the target. Such sensors are found in many areas of technology including robotics, automotive, manufacturing and so forth. For example, a magnetic field sensor may be used to detect when a vehicle's wheel locks up, triggering the vehicle's control processor to engage the anti-lock braking system. In this example, the magnetic-field sensor may detect rotation of the wheel. Magnetic-field sensors may also detect distance to an object. For example, a magnetic-field sensor may be used to detect the position of a hydraulic piston.

SUMMARY

In one aspect, a magnetic-field sensor includes main coil circuitry configured to generate a first magnetic field signal at a first frequency. A reflected signal is generated from a target caused by the first magnetic field signal generated by the main coil circuitry. The magnetic-field sensor also includes magnetoresistance circuitry configured to receive an error signal. The error signal is formed from a combination of the reflected signal and a second magnetic field signal. The magnetic-field sensor further includes analog circuitry configured to receive an output signal from the magnetoresistance circuitry, digital circuitry configured to receive an output signal from the analog circuitry, a mixer configured to receive a feedback signal from one of the digital circuitry or the analog circuitry, and secondary coil circuitry configured to receive a driver signal from the mixer causing the secondary coil circuitry to generate the second magnetic field signal at the first frequency.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAILED DESCRIPTION

Described herein are techniques to fabricate a magnetic-field sensor to reduce stray magnetic-field effects. Stray magnetic fields can adversely affect the sensitivity of some magnetoresistance elements. In one particular example, the magnetic-field sensor described herein is a closed-loop magnetic-field system that compensates for stray magnetic-field components in a reflected signal from a target. The techniques described herein enable magnetoresistance elements to be used in a bridge in the magnetic-field sensor even in environments where these magnetoresistance elements are not operating within their very small linear range (e.g., only a few Gauss). In one example, the techniques described herein allow the use of TMR elements, which have a very high sensitivity to a magnetic field, but their change of electrical properties in response to a change of magnetic field is mostly non-linear. In particular, the TMR elements are used as the first stage of a high gain amplifier in a negative feedback configuration. In a negative feedback configuration, the non-linearity of a TMR element is masked and therefore any associated stray magnetic-field effect is also masked.

As used herein, the term "magnetic-field sensor" is used to describe a circuit that uses a magnetic field sensing element, generally in combination with other circuits. Magnetic-field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic-field sensor is used in combination with a back-biased or other magnet, and a magnetic-field sensor that senses a magnetic-field density of a magnetic field.

As used herein, the term "target" is used to describe an object to be sensed or detected by a magnetic-field sensor or a magnetoresistance element. The target may include a conductive material that allows for eddy currents to flow within the target, for example a metallic target that conducts electricity.

Figure 1:
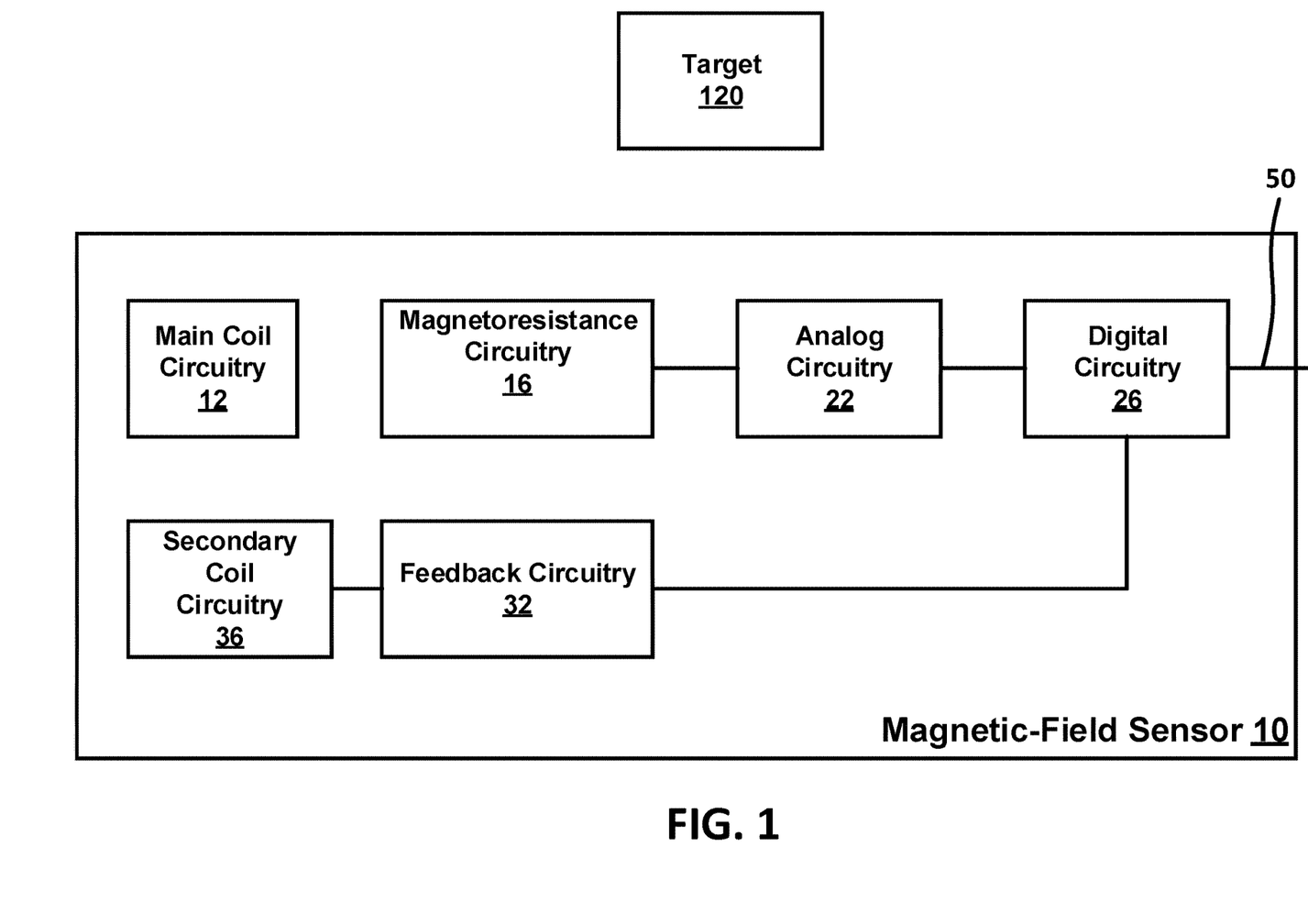
FIG. 1 is a block diagram of an example of a magnetic-field sensor to reduce stray magnetic-field effects.

Referring to FIG. 1, a magnetic-field sensor 10 includes main coil circuitry 12, magnetoresistance circuitry 16, analog circuitry 22, digital circuitry 26, feedback circuitry 32 and secondary coil circuitry 36. The main coil circuitry 12 is configured to generate a first magnetic field signal at a first frequency. The first magnetic field signal is reflected off a target 120 to form a reflected signal. In one example, the reflected signal is a function of the position of the target. The closer the target 120 is to the magnetic-field sensor 10, the larger in magnitude of the reflected signal, and the further the target 120 is to the magnetic-field sensor 10, the smaller in magnitude of the reflected signal or the reflected signal is zero.

In one example, the target 120 is a ferromagnetic target. In one example, the target 120 may be a rotating target. In some examples, the rotating target may include gear teeth.

The magnetoresistance circuitry 16 is configured to receive an error signal. The error signal is formed from a combination of the reflected signal from the target 120 and a second magnetic field signal generated by the secondary coil circuitry 36. The reflected signal includes undesirable signal components from, for example, a stray magnetic field. The second magnetic field signal generated by the secondary coil circuitry 36 is used, for example, to reduce the error signal. In one example, the second magnetic field signal is added to the reflected signal to form a magnetic-field error signal that is near zero.

The analog circuitry 22 is configured to receive an output signal from the magnetoresistance circuitry 16 and to demodulate the output signal from the magnetoresistance circuitry 16 to a baseband signal. The analog circuitry 22 also converts the baseband signal from an analog signal to a digital signal.

The digital circuitry 26 receives the digital baseband signal from the analog circuitry 22 and filters the digital baseband signal. The filtered digital baseband signal is provided to the feedback circuitry 32 as a feedback signal. The filtered digital baseband signal also is sent to additional components of the digital circuitry 26, which produce an output signal 50 of the magnetic field sensor 10. In some examples, the output signal may indicate the angle and/or position of the target 120.

The feedback circuitry 32 performs additional filtering on feedback signal from the digital circuitry 32 and converts the feedback signal from a digital signal to an analog signal. In one example, a digital voltage signal is converted to an analog current signal. The analog signal is modulated by the first frequency and provided to the secondary coil circuitry 36. The secondary coil circuitry 36 generates the second magnetic field signal at the first frequency.

Figure 2:
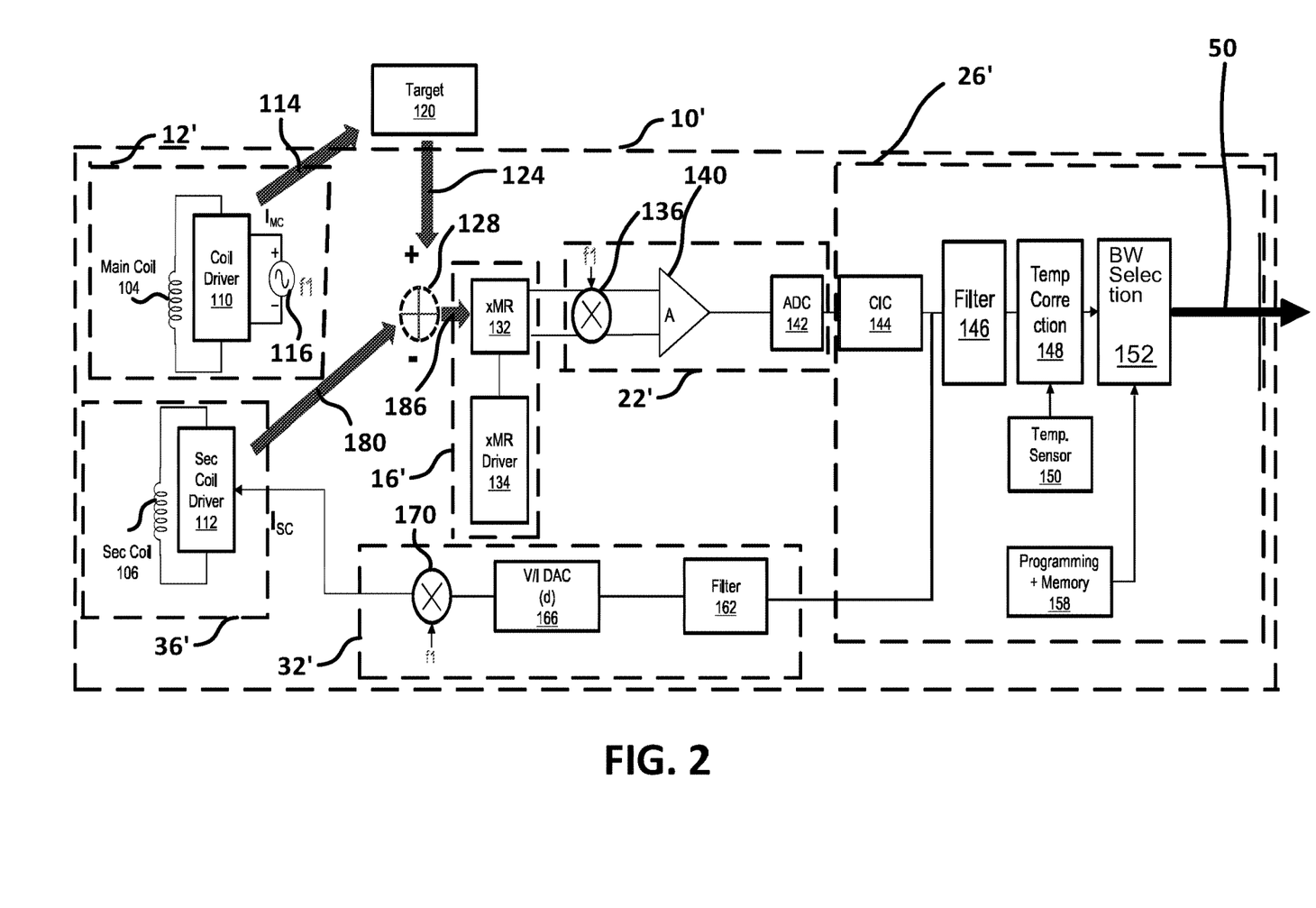
FIG. 2 is a block diagram of an example of the magnetic-field sensor of FIG. 1.

Referring to FIG. 2, an example of the magnetic-field sensor 10 is a magnetic-field sensor 10'. The magnetic-field sensor 10' includes main coil circuitry 12', magnetoresistance circuitry 16', analog circuitry 22', digital circuitry 26', feedback circuitry 32' and secondary coil circuitry 36'.

The main coil circuitry 12' is an example of the main coil circuitry 12. In one example, the main coil circuitry 12' may include a main coil 104, a coil driver 110 and a source 114 (e.g., a current source or a voltage source). The source 116 provides an AC current $I_{MC}$ at the first frequency f1. In one example, the first frequency f1 is between 1 and 8 MHz.

The current $I_{MC}$ enables the coil driver circuit 110 to power the main coil 104 to generate a magnetic field signal 114. In one example, the main coil 104 has a coupling factor $K_{MC}$ of 60 Gauss per amp.

The magnetoresistance circuitry 16' is an example of the magnetoresistance circuitry 16. In one example, the magnetoresistance circuitry 16' includes magnetoresistance elements 132 and a magnetoresistance element driver 134 that drives the magnetoresistance elements 132. The magnetoresistance elements 132 receive a magnetic-field error signal 186, which is converted into a differential output voltage signal called herein an error signal $V_i$.

The analog circuitry 22' is an example of the analog circuitry 22. In one example, the analog circuitry 22' may include a mixer 136, an amplifier 140 and an analog-to-digital converter (ADC) 142.

The mixer 136 receives the error signal $V_i$ from the magnetoresistance circuitry 16' and demodulates the error signal $V_i$ with the first frequency to form a baseband signal. The baseband signal is amplified by the amplifier 140 by a gain A. The amplified baseband signal is converted from an analog signal to a digital signal by the ADC 142. In one example, the ADC 142 may be a sigma-delta ADC.

The digital circuitry 26' is an example of the digital circuitry 26. In one example, the digital circuitry 26' may include a cascaded integrator-comb (CIC) filter 144, a filter 146, a temperature correction circuit 148, a temperature sensor 150, a bandwidth (BW) selection circuit 152 and a programming and memory circuit 158.

The CIC filter 144 receives the digital baseband signal from the ADC 142. The filter 146 may be a low pass filter configured to filter noise and other artifacts from output of the CIC filter 144 to produce an output voltage signal $V_o$. The temperature correction circuit 148 may scale the output voltage signal $V_o$ according to temperature (e.g., a temperature measured by the temperature sensor 150). The BW selection circuit 152 provides a further low-pass filtering with a selectable cut off frequency to generate the output signal 50.

The feedback circuitry 32' is an example of the feedback circuitry 32. In one example, the feedback circuitry 32' includes a filter 162, a digital-to analog converter (DAC) 166 and a mixer 170. The filter 162 may be a low pass filter configured to filter noise and other artifacts from output of the CIC filter 144. The DAC 166 receives the filtered digital output signal from the filter 162 and converts the filtered digital output signal to an analog signal and converts the filtered digital output signal from a digital voltage signal to an analog current signal. The analog current signal from the DAC 162 is provided to a mixer 170. The mixer 170 mixes the analog current signal with the first frequency f1 to form an AC current signal $I_{SC}$ to enable the secondary coil driver circuit 112 to drive the secondary coil 106.

The secondary coil circuitry 36' is an example of the secondary coil circuitry 36. In one example, the secondary coil circuitry 36' includes a secondary coil 106 and a secondary coil driver 112. The AC current signal $I_{SC}$ enables the secondary coil driver circuit 112 to power the secondary coil 106 to produce the magnetic field signal 180. In one example, the secondary coil 106 has a coupling factor $K_{SC}$ of 800 Gauss per amp.

The magnetic field signal 180 is combined with the reflected field signal 124 at a medium 128 to form the magnetic-field error signal 186. The medium 128 may be air. The medium 128 may not be on the magnetic field sensor 10'.

The magnetic field sensor 10' may be analyzed in terms of the error signal $V_i$, the output $V_o$ and the reflected signal 124 as defined as:

$$V_i = B_{RF}(x) \cdot S_{TMR} - V_o \cdot d \cdot K_{SC} \cdot S_{TMR},$$

where $B_{RF}(x) \cdot S_{TMR}$ is the magnetic field signal 114 and $V_o \cdot d \cdot K_{SC} \cdot S_{TMR}$ is the magnetic field signal 180, and:

$$V_0 = V_i \cdot A = (B_{RF}(x) \cdot S_{TMR} - V_o \cdot d \cdot K_{SC} \cdot S_{TMR}) \cdot A,$$

$$B_{RF(x)} = I_{MC} \cdot K_R(x),$$

$$K_R(x) = \frac{K_{MC} \cdot K_{cond}}{x^2},$$

$$I_{SC} = V_o \cdot d,$$

where:
$S_{TMR}$=TMR sensitivity,
d=voltage—to—current feedback gain,
$A \cdot S_{TMR}$=loop gain,
$B_{RF}(x)$=reflected field as a function of the target's position x,
$K_R$ (x)=reflected field coupling factor.

The system gain of the magnetic field sensor 10' may be expressed as:

$$\frac{V_o}{K_R(x)} = \frac{I_{MC} \cdot S_{TMR} \cdot A}{1 + d \cdot K_{SC} \cdot S_{TMR} \cdot A}.$$

For $S_{TMR} \cdot A \gg 1$, then the system gain of the magnetic field sensor 10' becomes $$\frac{I_{MC}}{d \cdot K_{SC}}.$$

For a high enough loop gain, the system gain is independent of $S_{TMR}$ and the output voltage $V_o$ is proportional to the reflection coefficient:

$$V_o = K_R \cdot \frac{I_{MC}}{d \cdot K_{SC}}.$$

Thus, the proportionality factor depends on the ratio of the main coil current $I_{MC}$ to the voltage-to-current feedback gain d and the secondary coil coupling factor $K_{SC}$.

Since the reflected signal 124 is modulated at a high frequency, the magnetic-field error signal 186 is demodulated from the first frequency f1 in the forward path down to the baseband for further conditioning. Therefore, the magnetic-field feedback loop remodulates the conditioned signal back to the first frequency f1 before magnetically subtracting it from the originally reflected signal 124.

As described herein, the non-linear behavior of a TMR element in a bridge is masked by the magnetic-field closed-loop approach and the overall system gain does not depend on the sensitivity of a TMR. The secondary coil 106 compensates for reflected fields from the target 120 and keeps the TMR element at an operating point at or near zero Gauss.

While the example above described the system gain with a bridge that includes at least one TMR element, one of ordinary skill in the art recognizes that the magnetic-field senor 10' is not limited to a bridge having at least one TMR element.

Figure 3:
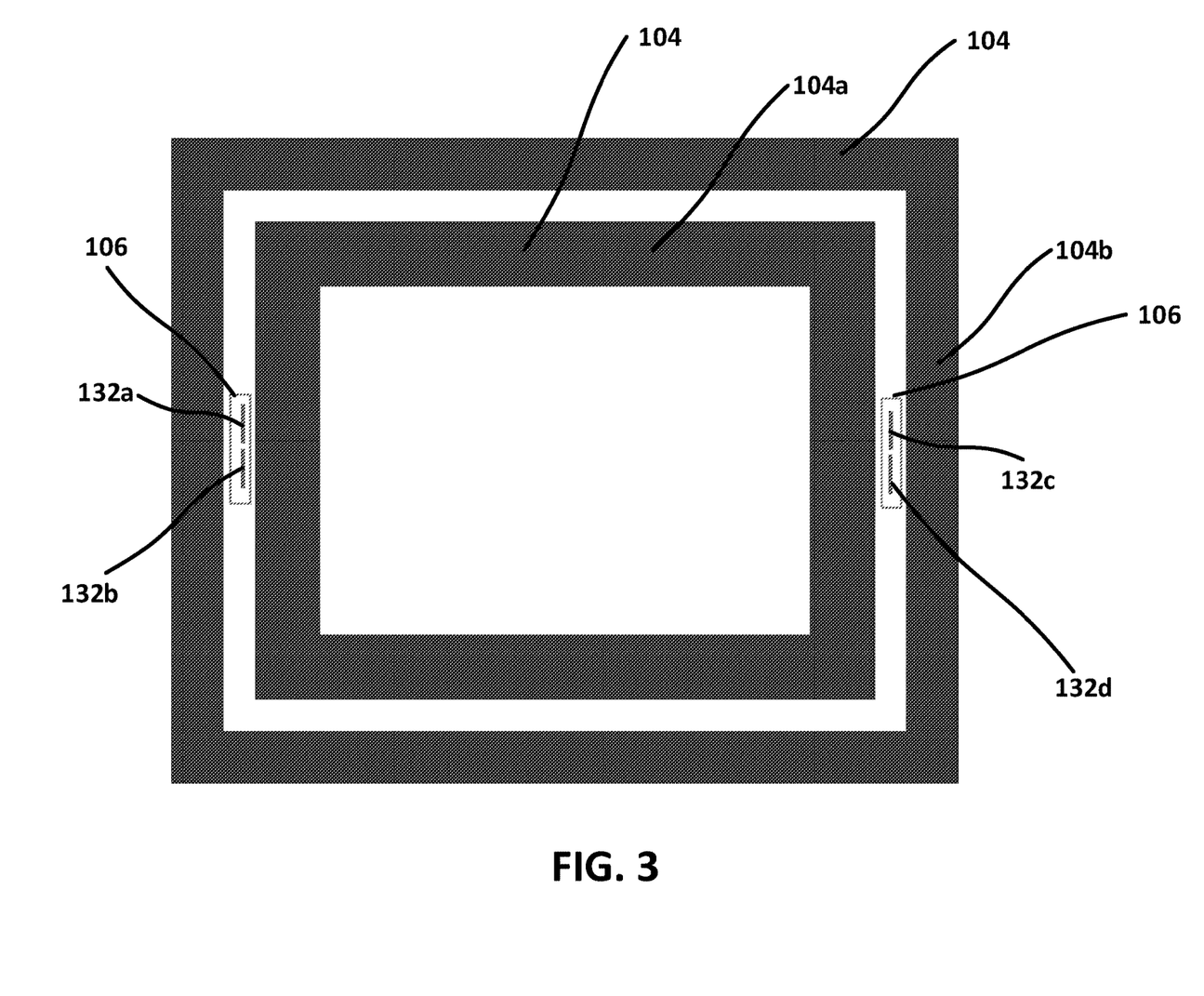
FIG. 3 is a diagram of a bridge with a main coil and a secondary coil.

Referring to FIG. 3, the magnetoresistance circuitry 132 (FIG. 1) may include a magnetoresistance element 132a, a magnetoresistance element 132b, a magnetoresistance element 132c, and a magnetoresistance element 132d in a bridge. The magnetoresistance elements 132a-132d may be GMR elements and/or TMR elements.

The main coil 104 includes inner loops 104a and outer loops 104b. For simplicity, each loop within the inner loops 104a and the outer loops 104b is not depicted. The magnetoresistance elements 132a-132d may be positioned between the inner loops 104a and the outer loops 104b. In one example, the magnetoresistance elements 132a, 132b may be disposed at one end of the main coil 122 and the magnetoresistance elements 132c, 132d may be disposed at the other end of the main coil 104.

In one example, a number of inner loops 104a differ from a number of outer loops 104b by no more than one loop. In another example, the number of inner loops 104a is equal to the number of outer loops 104b.

The secondary coil 106 surrounds the magnetoresistance elements 132a-132d. The secondary coil 106 is between the magnetoresistance elements 132a-132d and the main coil 104. A distance between the secondary coil 106 to the magnetoresistance elements 132a-132d is smaller than a distance between the main coil 104 to the magnetoresistance elements 132a-132d. The coupling factor of the secondary coil is about 10 to 20 times the main coil coupling factor because the secondary coil 106 is much closer to the magnetoresistance elements 132a-132d than the main coil 104. Thus, compensating for the reflected signal 124 is not expensive in terms of area consumed on an integrated circuit and or the amount of power consumed.

In one example, the secondary coil 106 is wound in a first direction and the main coil is wound in a second direction opposite the first direction. In one example, the first direction is clockwise. In another example, the first direction is counterclockwise. In another example, the secondary coil 106 is wound in a direction that reduces the error signal.

Figure 4:
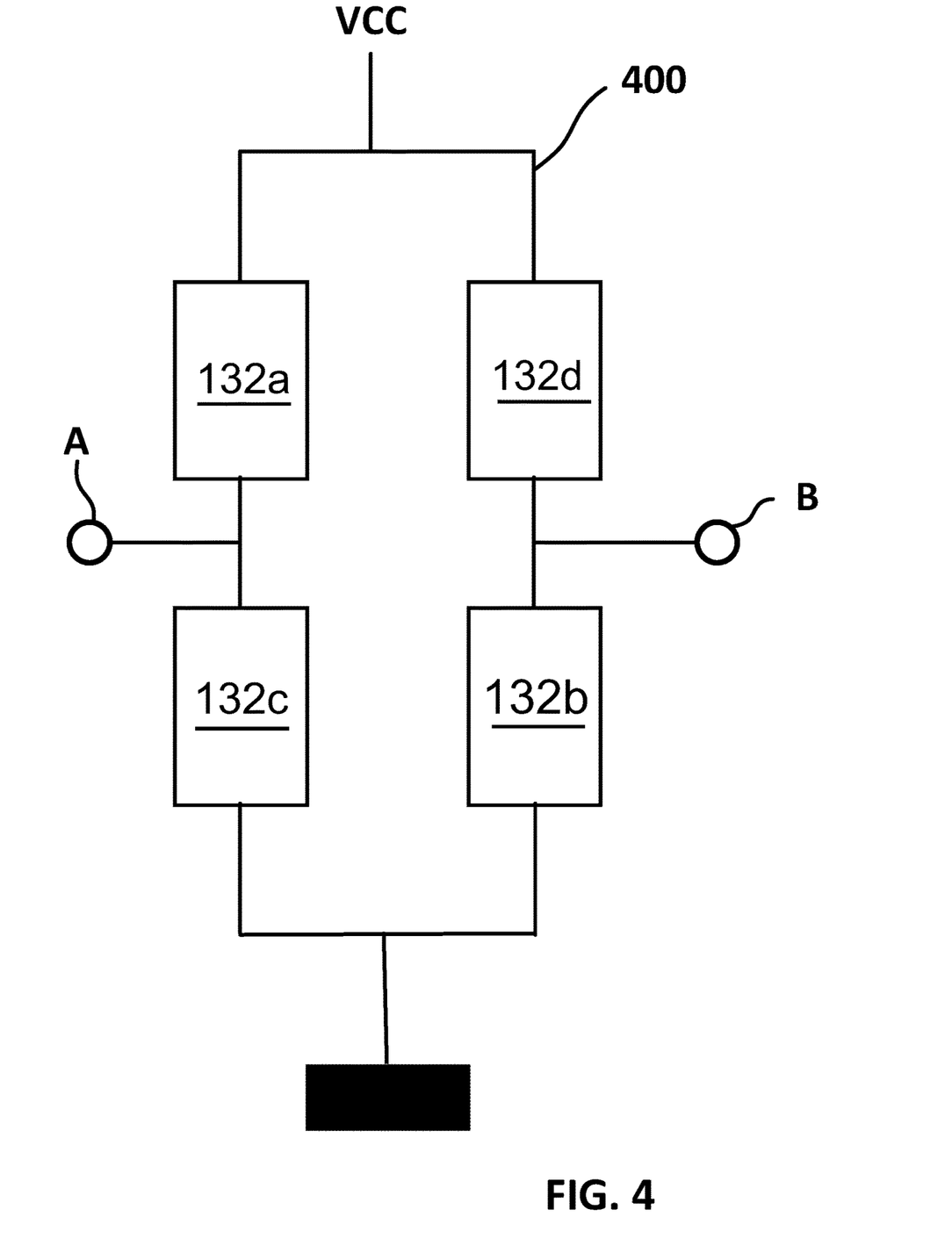
FIG. 4 is a circuit diagram of the bridge.

Referring to FIG. 4, the magnetoresistance elements 132a-132d may be arranged in a single bridge. For example, a bridge 400 may include the magnetoresistance elements 132a-132d. The magnetoresistance elements 132a, 132c are connected in electrical series on one leg of the bridge 400, and the magnetoresistance elements 132b, 132d are connected in series on the other leg of the bridge 400, which is electrically in parallel with the magnetoresistance elements 132a, 132c.

A node A is between the magnetoresistance elements 132a, 132c and a node B is between the magnetoresistance elements 132b, 132d. In one particular example, a voltage difference between the nodes A and B produces the error voltage $V_i$.

The magnetoresistance elements 132a-132d may be GMR elements and/or TMR elements. The bridge 400 may be one of a voltage bridge, a current bridge, or a conductance bridge.

Figure 5:
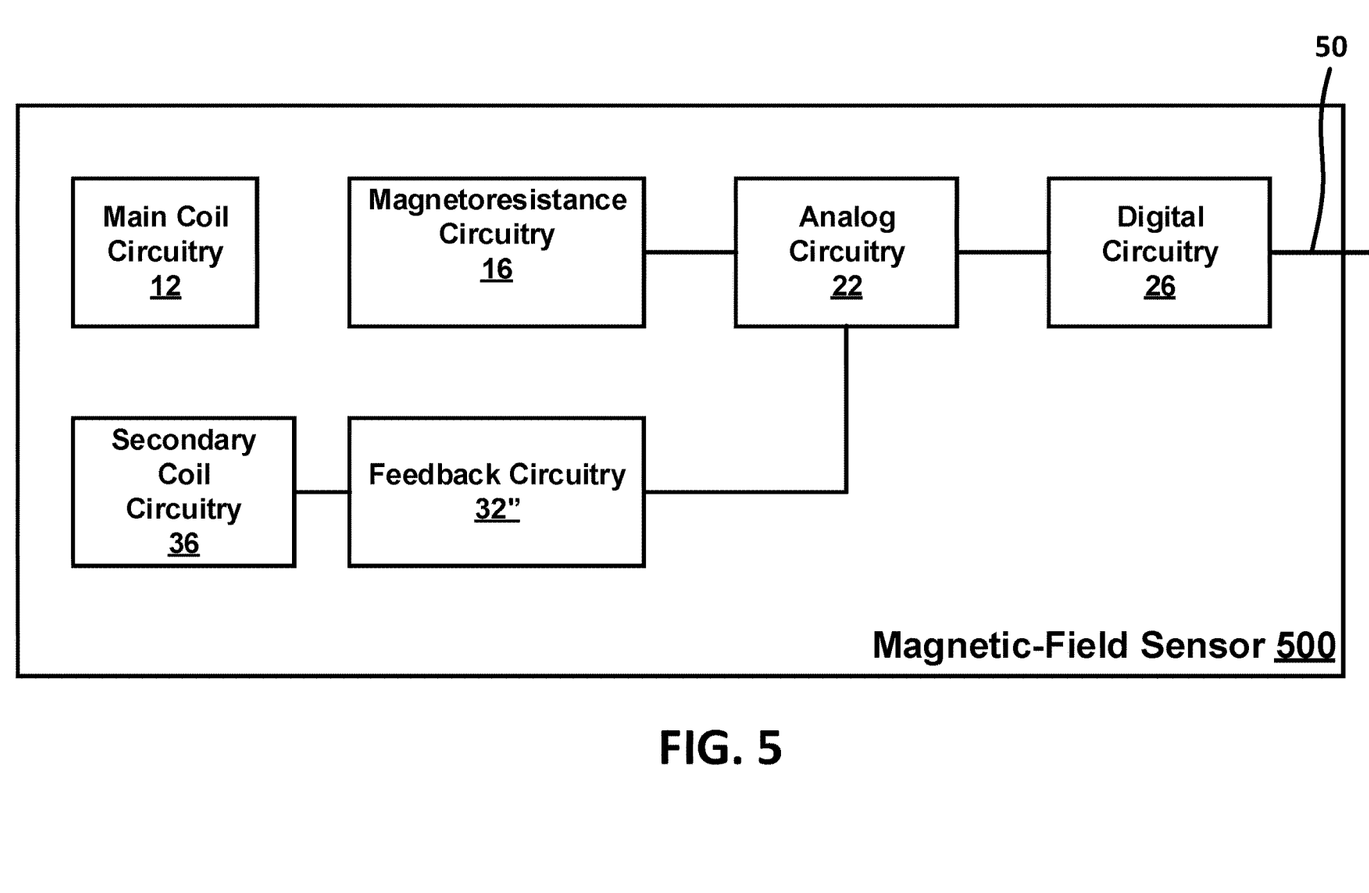
FIG. 5 is block diagram of another example of the magnetic-field sensor of FIG. 1.

Referring to FIG. 5, the magnetic-field sensor may be fabricated in other configurations. For example, a magnetic-field sensor 500 is the same as the magnetic-field sensor 10 except the feedback circuitry 32 is connected to the analog circuitry 22 instead of the digital circuitry 26. In particular, the feedback signal to the feedback circuitry 32 from the analog circuitry 22 is an analog signal instead of a digital signal.

In one particular example, the magnetic-field sensor 500 may be configured to have the output of the amplifier 140 (FIG. 2) connected to a feedback circuitry 32". In this example, a feedback circuitry 32" is the same as the feedback circuitry 32' (FIG. 2) except the feedback circuitry 32' does not need a DAC. However, the feedback circuitry 32" still would require a converter (not shown) to receive the feedback voltage and to convert the voltage signal to a current signal.

Having described preferred embodiments, which serve to illustrate various concepts, structures, and techniques, which are the subject of this patent, it will now become apparent to those of ordinary skill in the art that other embodiments incorporating these concepts, structures and techniques may be used.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A magnetic-field sensor comprising:
    main coil circuitry configured to generate a first magnetic field signal at a first frequency, wherein a reflected signal is generated from a target caused by the first magnetic field signal generated by the main coil circuitry;
    magnetoresistance circuitry configured to receive an error signal, wherein the error signal is formed from a combination of the reflected signal and a second magnetic field signal;
    analog circuitry configured to receive an output signal from the magnetoresistance circuitry;
    digital circuitry configured to receive an output signal from the analog circuitry;
    a first mixer configured to receive a feedback signal from one of the digital circuitry or the analog circuitry, wherein the feedback signal is a baseband signal, wherein the first mixer is configured to convert the feedback signal from the baseband signal to an alternating current (AC) signal having a frequency equal to the first frequency and to provide the AC signal to the secondary coil circuitry as a driver signal; and
    secondary coil circuitry configured to receive the driver signal from the first mixer causing the secondary coil circuitry to generate the second magnetic field signal at the first frequency.

2. The magnetic-field sensor of claim 1, wherein the magnetic-field sensor is fabricated in an integrated circuit.

3. The magnetic-field sensor of claim 1, wherein the magnetoresistance circuitry comprises a bridge comprising magnetoresistance elements.

4. The magnetic-field sensor of claim 3, wherein the bridge is one of a voltage bridge, a current bridge, or a conductance bridge.

5. The magnetic-field sensor of claim 3, wherein the magnetoresistance elements comprise at least one tunneling magnetoresistance element (TMR).

6. The magnetic-field sensor of claim 3, wherein the magnetoresistance elements comprise at least one giant magnetoresistance element (GMR).

7. The magnetic-field sensor of claim 3, wherein the main coil circuitry comprises a first coil having inner loops and outer loops,
    wherein a number of the inner loops differ from a number of the outer loops by no more than one loop, and
    wherein the magnetoresistance elements are disposed between the inner loops and the outer loops.

8. The magnetic-field sensor of claim 7, wherein the number of the inner loops is equal to the number of the outer loops.

9. The magnetic-field sensor of claim 8, wherein the second coil circuitry comprises a second coil, and
    wherein the magnetoresistance elements are within the second coil.

10. The magnetic-field sensor of claim 9, wherein a distance between the second coil to the magnetoresistance elements is smaller than a distance between the first coil to the magnetoresistance elements.

11. The magnetic-field sensor of claim 9, wherein the second coil is wound in a first direction and the first coil is wound in a second direction opposite the first direction.

12. The magnetic-field sensor of claim 1, further comprising a digital-to-analog converter configured to:
    receive the feedback signal from the digital circuitry;
    convert the feedback signal from a digital signal to an analog signal; and
    provide the feedback signal as the analog signal to the first mixer.

13. The magnetic-field sensor of claim 12, wherein the first mixer is configured to receive the feedback signal from the analog circuitry.

14. The magnetic-field sensor of claim 12, wherein the analog circuitry comprises a second mixer, wherein the second mixer converts the output signal from the magnetoresistance circuitry into the baseband signal.

15. The magnetic-field sensor of claim 14, wherein the analog circuitry further comprises an amplifier that amplifies the baseband signal received from the second mixer.

16. The magnetic-field sensor of claim 1, wherein the analog circuitry comprises:
    a second mixer, wherein the second mixer converts the output signal from the magnetoresistance circuitry into the baseband signal; and
    an analog-to-digital (ADC) converter configured to convert an output of the second mixer to a digital signal and to provide the digital signal to the digital circuitry.

17. The magnetic-field sensor of claim 16, wherein the analog circuitry further comprises an amplifier configured to:
    amplify the baseband signal received from the second mixer; and
    provide the baseband signal amplified by the amplifier to the ADC converter.

* * * * *

UNITED STATES PATENT AND TRADEMARK OFFICE
CERTIFICATE OF CORRECTION

PATENT NO. : 11,624,791 B2
APPLICATION NO. : 17/937556
DATED : April 11, 2023
INVENTOR(S) : Hernán D. Romero Page 1 of 1

It is certified that error appears in the above-identified patent and that said Letters Patent is hereby corrected as shown below:

In the Specification

Column 2, Line 23 delete "is block" and replace with --is a block--.

Column 3, Lines 48-49 delete "on feedback" and replace with --on the feedback--.

Column 3, Line 49 delete "32" and replace with --26--.

Column 3, Line 64 delete "114" and replace with --116--.

Column 4, Line 51 delete "DAC 162" and replace with --DAC 166--.

Column 6, Line 2 delete "senor" and replace with --sensor--.

Column 6, Line 16 delete "122" and replace with --104--.

Column 6, Line 35 delete "and or" and replace with --and/or--.

Column 6, Line 63 delete "32" and replace with --32"--.

Column 6, Line 65 delete "signal to the" and replace with --signal coupled to the--.

Column 6, Line 65 delete "32" and replace with --32"--.

Signed and Sealed this
Twenty-seventh Day of August, 2024

Katherine Kelly Vidal
*Director of the United States Patent and Trademark Office*